(12) United States Patent
Futase

(10) Patent No.: US 11,424,292 B2
(45) Date of Patent: Aug. 23, 2022

(54) MEMORY ARRAY CONTAINING CAPPED ALUMINUM ACCESS LINES AND METHOD OF MAKING THE SAME

(71) Applicant: WESTERN DIGITAL TECHNOLOGIES, INC., San Jose, CA (US)

(72) Inventor: Takuya Futase, Yokkaichi (JP)

(73) Assignee: WESTERN DIGITAL TECHNOLOGIES, INC., San Jose, CA (US)

( * ) Notice: Subject to any disclaimer, the term of this patent is extended or adjusted under 35 U.S.C. 154(b) by 120 days.

(21) Appl. No.: 16/907,523

(22) Filed: Jun. 22, 2020

(65) Prior Publication Data
US 2021/0399053 A1    Dec. 23, 2021

(51) Int. Cl.
*H01L 27/24*    (2006.01)
*G11C 13/00*    (2006.01)
*G11C 5/02*    (2006.01)
*H01L 45/00*    (2006.01)

(52) U.S. Cl.
CPC .......... *H01L 27/2463* (2013.01); *G11C 5/025* (2013.01); *G11C 13/0002* (2013.01); *H01L 45/1233* (2013.01)

(58) Field of Classification Search
CPC .................................................. H01L 27/2463
See application file for complete search history.

(56) References Cited

U.S. PATENT DOCUMENTS

| | | | |
|---|---|---|---|
| 6,680,500 B1* | 1/2004 | Low | ......... H01L 21/76834 257/295 |
| 8,097,498 B2 | 1/2012 | Purayath et al. | |
| 10,050,194 B1 | 8/2018 | Nardi et al. | |
| 10,199,434 B1 | 2/2019 | Lee et al. | |

(Continued)

FOREIGN PATENT DOCUMENTS

| | | | |
|---|---|---|---|
| JP | 2001-217405 A | 8/2001 |
| JP | 2009-231585 A | 10/2009 |

(Continued)

OTHER PUBLICATIONS

Notification of Transmittal of the International Search Report and the Written Opinion of the International Searching Authority for International Patent Application No. PCTUS2020/067673, dated Mar. 16, 2021, 10 pages.

(Continued)

*Primary Examiner* — Marvin Payen
(74) *Attorney, Agent, or Firm* — The Marbury Law Group PLLC

(57) ABSTRACT

A cross-point memory device includes first conductive line structures laterally extending along a first horizontal direction, an array of memory pillar structures overlying top surfaces of the first conductive line structures, such that each of the memory pillar structures includes a respective memory element, and second conductive line structures laterally extending along a second horizontal direction and overlying top surfaces of the array of memory pillar structures. At least one of the first conductive line structures and the second conductive line structures each includes a respective aluminum-containing rail and a respective metallic cap strip in contact with a top surface of the respective aluminum-containing rail.

2 Claims, 12 Drawing Sheets

(56) References Cited

U.S. PATENT DOCUMENTS

| | | |
|---|---|---|
| 10,249,683 B1 | 4/2019 | Lille et al. |
| 10,381,366 B1 | 8/2019 | Takahashi et al. |
| 10,381,409 B1 | 8/2019 | Zhou et al. |
| 10,381,411 B2 | 8/2019 | Lille |
| 10,381,559 B1 | 8/2019 | Zhou et al. |
| 10,388,646 B1 | 8/2019 | Stewart et al. |
| 2003/0199104 A1 | 10/2003 | Leuschner et al. |
| 2009/0090899 A1 | 4/2009 | Lim et al. |
| 2016/0181321 A1* | 6/2016 | Jung .......... H01L 45/1233 257/4 |
| 2019/0189688 A1 | 6/2019 | Lille |
| 2019/0259772 A1 | 8/2019 | Takahashi et al. |
| 2019/0259946 A1 | 8/2019 | Makala et al. |
| 2019/0288192 A1 | 9/2019 | Takahashi et al. |
| 2020/0005863 A1 | 1/2020 | Grobis et al. |

FOREIGN PATENT DOCUMENTS

| | | |
|---|---|---|
| JP | 2010-157560 A | 7/2010 |
| JP | 2014-209613 A | 11/2014 |

OTHER PUBLICATIONS

Xu, S.W. et al., "Homopolar Bonds in Se-Rich Ge—As—Se Chalcogenide Glasses," Chin. Phys. B, vol. 25, No. 5, 5 pages, (2016).

U.S. Appl. No. 16/410,326, filed May 13, 2019, SanDisk Technologies LLC.

U.S. Appl. No. 16/410,376, filed May 13, 2019, SanDisk Technologies LLC.

U.S. Appl. No. 16/432,356, filed Jun. 5, 2019, SanDisk Technologies LLC.

U.S. Appl. No. 16/436,185, filed Jun. 10, 2019, Western Digital Technologies, Inc.

U.S. Appl. No. 16/440,250, filed Jun. 13, 2019, SanDisk Technologies LLC.

U.S. Appl. No. 16/440,378, filed Jun. 13, 2019, Western Digital Technologies, Inc.

U.S. Appl. No. 16/453,372, filed Jun. 26, 2019, Western Digital Technologies, Inc.

U.S. Appl. No. 16/857,053, filed Apr. 23, 2020, SanDisk Technologies LLC.

* cited by examiner

MEMORY ARRAY CONTAINING CAPPED ALUMINUM ACCESS LINES AND METHOD OF MAKING THE SAME

FIELD

The present disclosure relates generally to the field of semiconductor devices, and specifically to a memory array containing capped aluminum access lines and methods of forming the same.

BACKGROUND

A phase change material (PCM) memory device is a type of non-volatile memory device that stores information as a resistive state of a material that can be in different resistive states corresponding to different phases of the material. The different phases can include an amorphous state having high resistivity and a crystalline state having low resistivity (i.e., a lower resistivity than in the amorphous state). The transition between the amorphous state and the crystalline state can be induced by controlling the rate of cooling after application of an electrical pulse that renders the phase change memory material amorphous in a first part of a programming process. The second part of the programming process includes control of the cooling rate of the phase change memory material. If rapid quenching occurs, the phase change memory material can cool into an amorphous high resistivity state. If slow cooling occurs, the phase change memory material can cool into a crystalline low resistivity state.

SUMMARY

According to an aspect of the present disclosure, a cross-point memory device includes first conductive line structures laterally extending along a first horizontal direction, an array of memory pillar structures overlying top surfaces of the first conductive line structures, such that each of the memory pillar structures includes a respective memory element, and second conductive line structures laterally extending along a second horizontal direction and overlying top surfaces of the array of memory pillar structures. At least one of the first conductive line structures and the second conductive line structures each includes a respective aluminum-containing rail and a respective metallic cap strip in contact with a top surface of the respective aluminum-containing rail.

According to another aspect of the present disclosure, a method of forming a cross-point memory device comprises forming a set of first conductive line structures laterally extending along a first horizontal direction over a substrate, forming memory-level material layers over the set of first conductive line structures, forming a set of second conductive line structures laterally extending along a second horizontal direction over top surfaces of the array of memory pillar structures, and patterning the memory-level material layers into an array of memory pillar structures. Each of the memory pillar structures comprises a respective memory element, and at least one of the first conductive line structures and the second conductive line structures each comprise a respective aluminum-containing rail and a respective metallic cap strip in contact with a top surface of the respective aluminum-containing rail.

DETAILED DESCRIPTION

Figure 1A:
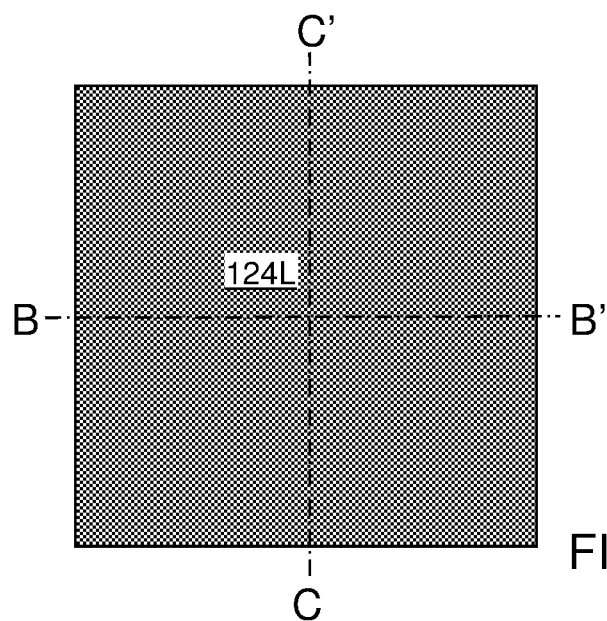
FIG. 1A is a top-down view of an exemplary structure for forming a cross-point memory device after formation of a dielectric etch stop layer, a first metal layer, and a first metallic cap layer according to an embodiment of the present disclosure.

A cross-point memory array is an array of memory cells located at cross points of two sets of access lines located at different levels. One set of access lines can be word lines, and another set of access lines can be bit lines. Embodiments of the present disclosure are directed to a memory array containing capped aluminum access lines and methods of forming the same, the various aspects of which are described below. The capped aluminum access lines provide a low resistance which reduces the voltage drop in the access lines.

The drawings are not drawn to scale. Multiple instances of an element may be duplicated where a single instance of the element is illustrated, unless absence of duplication of elements is expressly described or clearly indicated otherwise. Ordinals such as "first," "second," and "third" are employed merely to identify similar elements, and different ordinals may be employed across the specification and the claims of the instant disclosure. The term "at least one" element refers to all possibilities including the possibility of a single element and the possibility of multiple elements.

The same reference numerals refer to the same element or similar element. Unless otherwise indicated, elements having the same reference numerals are presumed to have the same composition and the same function. Unless otherwise indicated, a "contact" between elements refers to a direct contact between elements that provides an edge or a surface shared by the elements. If two or more elements are not in direct contact with each other or among one another, the two elements are "disjoined from" each other or "disjoined among" one another. As used herein, a first element located "on" a second element can be located on the exterior side of a surface of the second element or on the interior side of the second element. As used herein, a first element is located "directly on" a second element if there exist a physical contact between a surface of the first element and a surface of the second element. As used herein, a first element is "electrically connected to" a second element if there exists a conductive path consisting of at least one conductive material between the first element and the second element.

As used herein, a "prototype" structure or an "in-process" structure refers to a transient structure that is subsequently modified in the shape or composition of at least one component therein.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between, or at, a top surface and a bottom surface of the continuous structure. A layer may extend horizontally, vertically, and/or along a tapered surface. A substrate may be a layer, may include one or more layers therein, or may have one or more layer thereupon, thereabove, and/or therebelow.

As used herein, a first surface and a second surface are "vertically coincident" with each other if the second surface overlies or underlies the first surface and there exists a vertical plane or a substantially vertical plane that includes the first surface and the second surface. A substantially vertical plane is a plane that extends straight along a direction that deviates from a vertical direction by an angle less than 5 degrees. A vertical plane or a substantially vertical plane is straight along a vertical direction or a substantially vertical direction, and may, or may not, include a curvature along a direction that is perpendicular to the vertical direction or the substantially vertical direction.

As used herein, a "memory level" or a "memory array level" refers to the level corresponding to a general region between a first horizontal plane (i.e., a plane parallel to the top surface of the substrate) including topmost surfaces of an array of memory elements and a second horizontal plane including bottommost surfaces of the array of memory elements. As used herein, a "through-stack" element refers to an element that vertically extends through a memory level.

As used herein, a "semiconducting material" refers to a material having electrical conductivity in the range from $1.0 \times 10^{-5}$ S/m to $1.0 \times 10^5$ S/m. As used herein, a "semiconductor material" refers to a material having electrical conductivity in the range from $1.0 \times 10^{-5}$ S/m to 1.0 S/m in the absence of electrical dopants therein, and is capable of producing a doped material having electrical conductivity in a range from 1.0 S/m to $1.0 \times 10^7$ S/m upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0 \times 10^5$ S/m. As used herein, an "insulator material" or a "dielectric material" refers to a material having electrical conductivity less than $1.0 \times 10^{-5}$ S/m. As used herein, a "heavily doped semiconductor material" refers to a semiconductor material that is doped with electrical dopant at a sufficiently high atomic concentration to become a conductive material either as formed as a crystalline material or if converted into a crystalline material through an anneal process (for example, from an initial amorphous state), i.e., to provide electrical conductivity greater than $1.0 \times 10^5$ S/m. A "doped semiconductor material" may be a heavily doped semiconductor material, or may be a semiconductor material that includes electrical dopants (i.e., p-type dopants and/or n-type dopants) at a concentration that provides electrical conductivity in the range from $1.0 \times 10^{-5}$ S/m to $1.0 \times 10^7$ S/m. An "intrinsic semiconductor material" refers to a semiconductor material that is not doped with electrical dopants. Thus, a semiconductor material may be semiconducting or conductive, and may be an intrinsic semiconductor material or a doped semiconductor material. A doped semiconductor material may be semiconducting or conductive depending on the atomic concentration of electrical dopants therein. As used herein, a "metallic material" refers to a conductive material including at least one metallic element therein. All measurements for electrical conductivities are made at the standard condition.

Figure 1B:
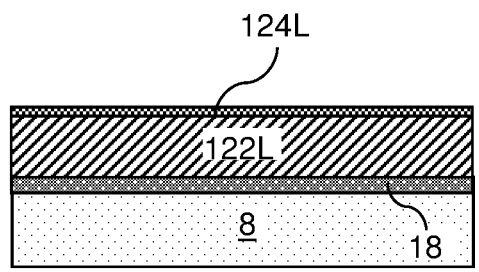
FIG. 1B is a vertical cross-sectional view of the exemplary structure along the vertical plane B-B' of FIG. 1A.
Figure 1C:
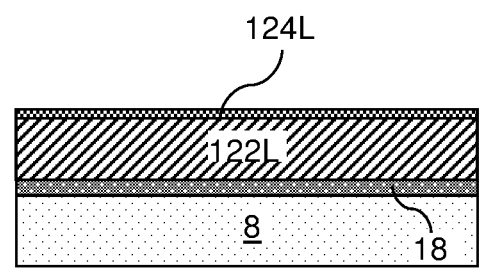
FIG. 1C is a vertical cross-sectional view of the exemplary structure along the vertical plane C-C' of FIG. 1A.

Referring to FIGS. 1A-1C, an exemplary structure for forming a cross-point array of memory elements is illustrated, which includes a substrate 8. The substrate 8 includes an insulating material layer in an upper portion, and may optionally include additional layers (not illustrated) underneath, which can include, for example, a semiconductor material layer and interconnect level dielectric layers embedding metal interconnect structures therein. In one embodiment, semiconductor devices such as field effect transistors may be provided on the semiconductor material layer, and the metal interconnect structures can provide electrically conductive paths among the semiconductor devices. The exemplary structure includes a memory array region, which is illustrated herein, and a peripheral region (not illustrated) including interconnect structures and/or peripheral devices. Memory cells are subsequently formed in the memory array region.

An optional dielectric etch stop layer 18 can be formed over the substrate 8. The dielectric etch stop layer 18 includes a dielectric material that can be employed as an etch stop material portion during a subsequent anisotropic etch process. For example, the dielectric etch stop layer 18 can include silicon nitride or a dielectric metal oxide (such as aluminum oxide). The thickness of the dielectric etch stop layer 18 can be in a range from 4 nm to 40 nm, although lesser and greater thicknesses can also be employed.

A first metal layer 122L and a first metallic cap layer 124L can be deposited over the dielectric etch stop layer 18. According to an aspect of the present disclosure, the first metal layer 122L comprises aluminum or an aluminum-containing alloy including aluminum at an atomic percentage in a range from 90% to 100%, such as from 98% to 100% with the remainder being alloying elements (e.g., copper and/or silicon). The first metal layer 122L can be deposited, for example, by physical vapor deposition, and can have a thickness in a range from 50 nm to 500 nm, although lesser and greater thicknesses can also be employed.

The first metallic cap layer 124L includes a hard and etch resistant cap material that can protect aluminum during a subsequent planarization process. The first metallic cap layer 124L can include a refractory transition metal in elemental form or in a form of a conductive metal alloy. For example, the first metallic cap layer 124L can comprise, and/or can consist essentially of, a metal selected from W, Ta, Mo or alloys thereof including W, Ta or Mo at an atomic percentage in a range from 90% to 100%, such as from 98% to 100% with the remainder being alloying elements (e.g., boron or silicon). The first metallic cap layer 124L can be deposited by physical vapor deposition or chemical vapor deposition. The first metallic cap layer 124L can have a thickness in a range from 2 nm to 10 nm, such as 3 nm to 5 nm, although lesser and greater thicknesses may also be employed. In one embodiment, the thickness of the first metallic cap layer 124L can be in a range from 2% to 20%, such as from 3% to 10%, of the thickness of the first metal layer 122L that comprises, and/or consists essentially of, aluminum or an aluminum-containing alloy.

Figure 2A:
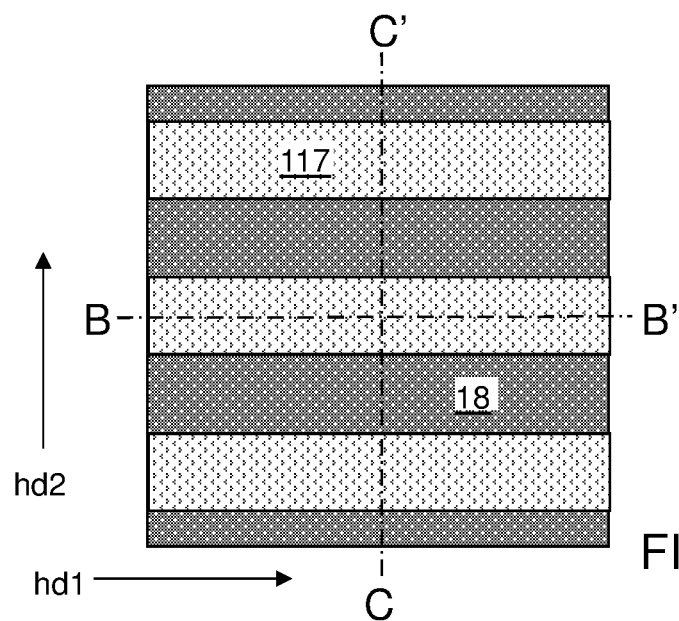
FIG. 2A is a top-down view of the exemplary structure after patterning the optional first metallic cap layer and the first metal layer into first conductive line structures according to an embodiment of the present disclosure.
Figure 2B:
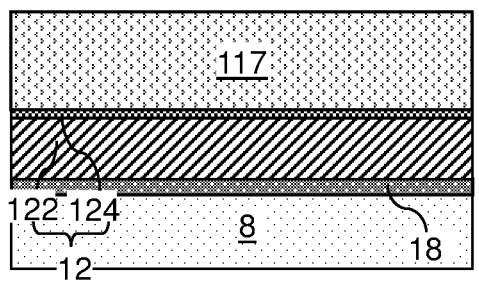
FIG. 2B is a vertical cross-sectional view of the exemplary structure along the vertical plane B-B' of FIG. 2A.
Figure 2C:
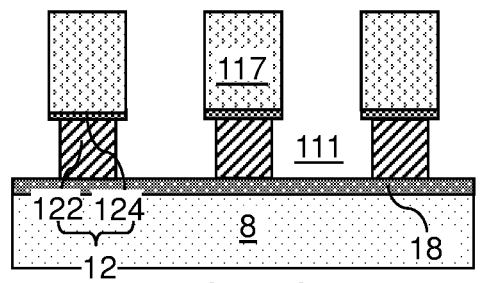
FIG. 2C is a vertical cross-sectional view of the exemplary structure along the vertical plane C-C' of FIG. 2A.

Referring to FIGS. 2A-2C, a photoresist layer 117 can be applied over the first metallic cap layer 124L, and can be lithographically patterned with a line and space pattern. Elongated openings laterally extending along a first horizontal direction hd1 and laterally spaced apart among one another along a second horizontal direction hd2 can be formed in the photoresist layer 117. The openings in the photoresist layer 117 can have the same width along the second horizontal direction hd2 that is invariant with translation along the first horizontal direction hd1. The width of each opening along the second horizontal direction hd2 can be in a range from 10 nm to 50 nm, such as 15 nm to 25 nm, although lesser and greater widths can also be employed.

The pattern in the photoresist layer 117 can be transferred through the first metallic cap layer 124L and the first metal layer 122L by an anisotropic etch process. The photoresist layer 117 has the line and space pattern, and can be employed as an etch mask during the anisotropic etch process. The anisotropic etch process may employ a chlorine-based etch chemistry or a fluorine-based etch chemistry. For example, a plasma of a mixture of $BCl_3$ and $Cl_2$, a plasma of $CF_4$ and optionally oxygen, and/or a plasma of $CHF_3$ and optionally oxygen may be employed. The layer stack of the first metallic cap layer 124L and the first metal layer 122L can be patterned into first conductive line structures 12. Each first conductive line structure 12 includes a first aluminum-containing rail 122 and a first metallic cap strip 124. As used herein, a "rail" or a "rail structure" refers to a structure that laterally extends along a horizontal direction with a uniform vertical cross-sectional shape within vertical planes that are perpendicular to the horizontal direction. Each patterned portion of the first metal layer 122L comprises a first aluminum-containing rail 122. Each patterned portion of the first metallic cap layer 124L comprises a first metallic cap strip 124. Each first metallic cap strip is a rail structure having a thickness that is less than a width along the second horizontal direction hd2. The photoresist layer 117 can be subsequently removed, for example, by ashing.

Each first conductive line structure 12 can include a vertical stack of a first aluminum-containing rail 122 and a first metallic cap strip 124. In one embodiment, sidewalls of the first aluminum-containing rail 122 can be vertically coincident with the sidewalls of the first metallic cap strip 124 within each first conducive line structure 12. This configuration can be achieved in case the anisotropic etch process that patterns the first conductive line structures 12 forms vertical sidewalls and does not provide collateral lateral etching during the anisotropic etch process. First line trenches 111 can be formed between each laterally neighboring pair of first conductive line structures 12.

In an alternative embodiment shown in FIG. 2C, a selective isotropic etch process can be performed to laterally recess sidewalls of the first aluminum-containing rails 122. The selective isotropic etch process may employ a dry etch process (such as a chemical dry etch process) or a wet etch process. The chemistry of the selective isotropic etch process can be selected such that aluminum is etches selective to the material of the first metallic cap strips 124. For example, a chemical etch process employing ferric chloride ($FeCl_3$) or a mixture of phosphoric acid, nitric acid, and acetic acid may be employed to laterally recess the first aluminum-containing rails 122. Alternatively, the anisotropic etch process may include an isotropic etchant to provide lateral recessing of the sidewalls of the first aluminum-containing rails 122. The lateral recess distance may be in a range from 1 nm to 20 nm, such as from 2 nm to 10 nm, although lesser and greater lateral recess distances may also be employed.

In case the first aluminum-containing rails 122 are laterally recessed relative to the first metallic cap strips 124, the first aluminum-containing rails 122 can have a lesser width than a respective overlying first metallic cap strip 124 within each of the first conductive line structures 12. In one embodiment, a pair of lengthwise sidewalls of each first aluminum-containing rails 122 can be laterally recessed from a pair of lengthwise sidewalls of a respective overlying first metallic cap strip 124 by a uniform lateral recess distance. A set of first conductive line structures 12 laterally extending along the first horizontal direction hd1 is formed over the substrate 8.

Figure 3A:
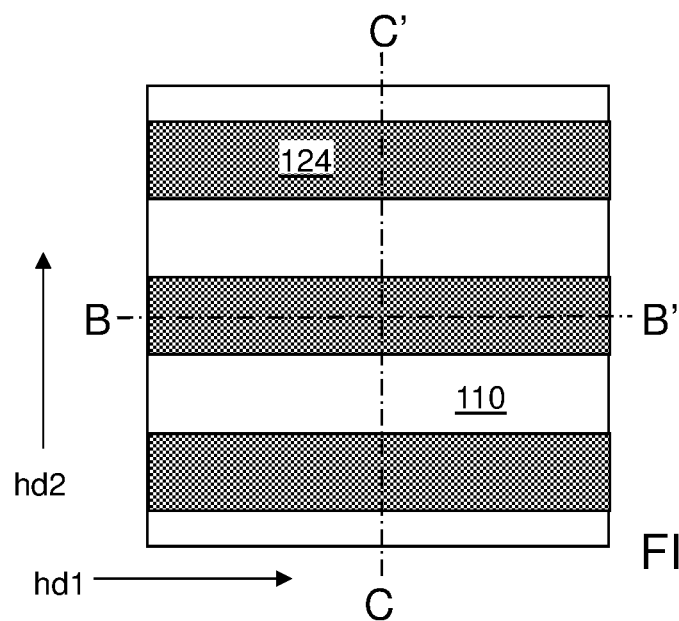
FIG. 3A is a top-down view of the exemplary structure after formation of first dielectric isolation rails between the first conductive line structures according to an embodiment of the present disclosure.
Figure 3B:
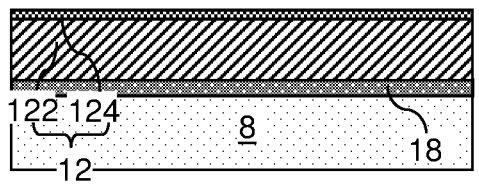
FIG. 3B is a vertical cross-sectional view of the exemplary structure along the vertical plane B-B' of FIG. 3A.
Figure 3C:
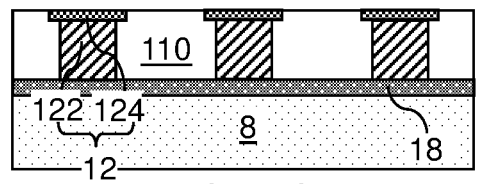
FIG. 3C is a vertical cross-sectional view of the exemplary structure along the vertical plane C-C' of FIG. 3A.

Referring to FIGS. 3A-3C, a dielectric fill material that can be subsequently planarized can be deposited in the first line trenches 111. For example, the dielectric fill material can include undoped silicate glass, a doped silicate glass, porous or non-porous organosilicate glass, or metal oxide (such as aluminum oxide). Excess portions of the dielectric fill material can be removed from above the horizontal plane including the top surface of the first conductive line structures 12 by a planarization process such as a chemical mechanical planarization (i.e., chemical mechanical polishing) (CMP) process followed by an alkali or acidic post CMP cleaning step. Each remaining portion of the dielectric fill material comprises a first dielectric isolation rail 110. Generally, the first dielectric isolation rails 110 are formed between each laterally neighboring pair of first conductive line structures 12 by depositing at least one dielectric fill material between, and over, the first conductive line structures 12, and by removing portions of the at least one dielectric fill material from above the horizontal plane including top surfaces of the first conductive line structures 12. The first aluminum-containing rails 122 are protected by the hard, etch resistant first metallic cap strip 124 from damage (e.g., scratches, etc.) during the CMP process and the post CMP cleaning step.

Figure 4A:
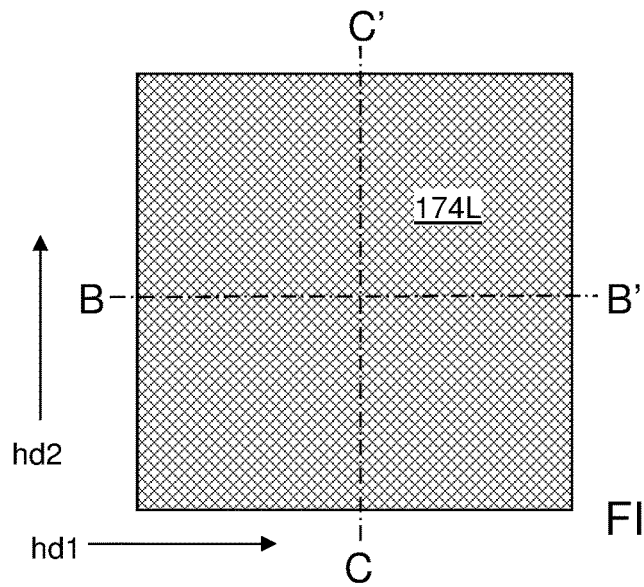
FIG. 4A is a top-down view of the exemplary structure after formation of a layer stack including a lower conductive liner, a selector material layer, an intermediate conductive liner, a memory material layer, and an upper conductive liner according to an embodiment of the present disclosure.
Figure 4B:
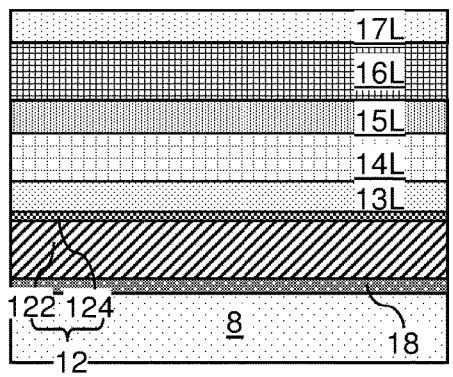
FIG. 4B is a vertical cross-sectional view of the exemplary structure along the vertical plane B-B' of FIG. 4A.
Figure 4C:
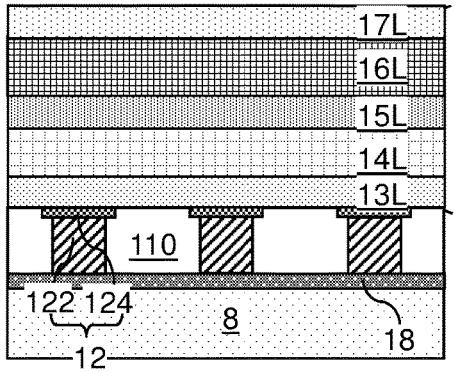
FIG. 4C is a vertical cross-sectional view of the exemplary structure along the vertical plane C-C' of FIG. 4A.

Referring to FIGS. 4A-4C, a layer stack including, from bottom to top, a lower conductive liner 13L, a selector material layer 14L, an intermediate conductive liner 15L, a memory material layer 16L, and a upper conductive liner 17L. In one embodiment, the positions of the selector material layer 14L and the memory material layer 16L may be reversed. The layers within the layer stack (13L, 14L, 15L, 16L, 17L) are collectively referred to as memory-level material layers (13L, 14L, 15L, 16L, 17L).

In one embodiment, each of the lower conductive liner 13L, the intermediate conductive liner 15L, and the upper conductive liner 17L includes at least one electrically conductive material. The at least one electrically conductive material may include a metallic material and/or a non-metallic conductive material. Exemplary metallic materials that can be employed for the lower conductive liner 13L, the intermediate conductive liner 15L, and the upper conductive liner 17L include a refractory transition metal, such as W, Ta, Mo or alloys thereof containing at least 90 atomic percent of the refractory transition metal. Exemplary non-metallic conductive materials that can be employed for the lower conductive liner 13L, the intermediate conductive liner 15L, and the upper conductive liner 17L include amorphous carbon, amorphous boron-doped carbon, amorphous nitrogen-doped carbon, alloys or mixtures thereof, and layer stacks thereof. Each of the lower conductive liner 13L, the intermediate conductive liner 15L, and the upper conductive liner 17L may be free of transition metal elements.

Figure 4D:
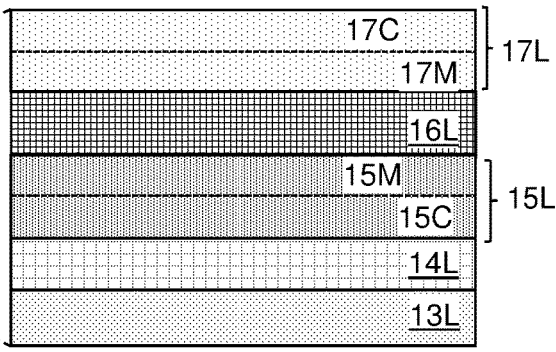
FIG. 4D is a close-up of the upper portion of the structure of FIG. 4C.

In one embodiment shown in FIG. 4D, the lower conductive liner 13L may comprise a doped or undoped carbon material which is free of transition metal elements. In contrast, the intermediate conductive liner 15L may comprise a lower doped or undoped carbon layer 15C which contacts the selector material layer 14L, and an upper refractory transition metal or metal alloy layer 15M which contacts the memory material layer 16L. Likewise, the upper conductive liner 17L may comprise a lower refractory transition metal or metal alloy layer 17M which contacts the memory material layer 16L and an upper doped or undoped carbon layer 17C. This way, the carbon layers (13L, 15C) may contact the selector material layer 14L, while the refractory transition metal or alloy layers (15M, 17M) may contact the memory material layer 16L, and act as diffusion barriers and adhesion layers between the memory material layer 16L and the carbon layers (15C, 17C). The carbon layers (15C, 17C) confine heat to change the phases of the memory material layer 16L during operation, sine the memory material layer may have a low thermal conductivity.

Each of the lower conductive liner 13L, the intermediate conductive liner 15L, and the upper conductive liner 17L may be deposited by chemical vapor deposition, physical vapor deposition, or atomic layer deposition. Each of the lower conductive liner 13L, the intermediate conductive liner 15L, and the upper conductive liner 17L can have a respective thickness in a range from 1 nm to 20 nm, such as from 2 nm to 10 nm, although lesser and greater thicknesses may also be employed.

The selector material layer 14L includes a material that can function as a voltage-dependent switch. Generally, the selector material layer 14L can include any suitable threshold switch material which exhibits non-linear electrical behavior, such as an ovonic threshold switch material or a diode threshold switch material (e.g., materials for p-n semiconductor diode, p-i-n semiconductor diode, Schottky diode or metal-insulator-metal diode). In one embodiment, the selector material layer 14L includes an ovonic threshold switch material.

As used herein, an ovonic threshold switch (OTS) is a device that does not crystallize in a low resistance state under a voltage above the threshold voltage, and reverts back to a high resistance state when not subjected to a voltage above the threshold voltage across the OTS material layer. As used herein, an "ovonic threshold switch material" refers to a material that displays a non-linear resistivity curve under an applied external bias voltage such that the resistivity of the material decreases with the magnitude of the applied external bias voltage. In other words, an ovonic threshold switch material is non-Ohmic, and becomes more conductive under a higher external bias voltage than under a lower external bias voltage.

An ovonic threshold switch material (OTS material) can be non-crystalline (for example, amorphous) in a high resistance state, and can remain non-crystalline (for example, remain amorphous) in a low resistance state during application of a voltage above its threshold voltage across the OTS material. The OTS material can revert back to the high resistance state when the high voltage above its threshold voltage is removed. Throughout the resistive state changes, the ovonic threshold switch material can remain non-crystalline (e.g., amorphous). In one embodiment, the ovonic threshold switch material can comprise layer a chalcogenide material which exhibits hysteresis in both the write and read states. The chalcogenide material may be a GeTe compound or a Ge—Se compound doped with a dopant selected from As, N, and C, such as a Ge—Se—As compound semiconductor material. The ovonic threshold switch material layer can include a selector material layer 14L which contains any ovonic threshold switch material. In one embodiment, the selector material layer 14L can include, and/or can consist essentially of, a GeSeAs alloy, a GeSe alloy, a SeAs alloy, a GeTe alloy, or a SiTe alloy.

In one embodiment, the material of the selector material layer 14L can be selected such that the resistivity of the selector material layer 14L decreases at least by two orders of magnitude (i.e., by more than a factor of 100) upon application of an external bias voltage that exceeds a critical bias voltage magnitude (also referred to as threshold voltage). In one embodiment, the composition and the thickness of the selector material layer 14L can be selected such that the critical bias voltage magnitude can be in a range from 1 V to 4 V, although lesser and greater voltages can also be employed for the critical bias voltage magnitude. The thickness of the selector material layer 14L can be, for example, in a range from 5 nm to 50 nm, such as from 10 nm to 30 nm, although lesser and greater thicknesses can also be employed.

The memory material layer 16L includes a memory material, i.e., a material that can be programmed to have at least two different memory states. In one embodiment, the memory material layer 16L includes a resistive memory material. As used herein, a "resistive memory material" or a "reversibly resistance-switching material" is a material of which the resistivity can be altered by application of a voltage across the material. As used herein, a "resistive memory material layer" refers to a layer including a resistive memory material. As used herein, a "resistive memory element" refers to an element that includes a portion of a resistive memory material in a configuration that enables programming of the resistive memory material into at least two states having different values of electrical resistance. The memory material layer 16L can include any type of resistive material.

In one embodiment, the resistive memory material layer 16L includes a phase change memory material to form a phase change random access memory ("PCRAM" or "PRAM") device. As used herein, a "phase change memory material" refers to a material having at least two different phases providing different resistivity. The at least two different phases can be provided, for example, by controlling the rate of cooling from a heated state to provide an amorphous state having a higher resistivity and a polycrystalline state having a lower resistivity. In this case, the higher resistivity state of the phase change memory material can be achieved by faster quenching of the phase change memory material after heating to an amorphous state, and the lower resistivity state of the phase change memory material can be achieved by slower cooling of the phase change memory material after heating to the amorphous state Exemplary phase change memory materials include, but are not limited to, germanium antimony telluride compounds such as $Ge_2Sb_2Te_5$ (GST), germanium antimony compounds, indium germanium telluride compounds, aluminum selenium telluride compounds, indium selenium telluride compounds, and aluminum indium selenium telluride compounds. These compounds (e.g., compound semiconductor material) may be doped (e.g., nitrogen doped GST) or undoped. Thus, the resistive memory material layer can include, and/or can consist essentially of, a material selected from a germanium antimony telluride compound, a germanium antimony compound, an indium germanium telluride compound, an aluminum selenium telluride compound, an indium selenium telluride compound, or an aluminum indium selenium telluride compound. The thickness of the resistive memory material layer 16L can be in a range from 1 nm to 60 nm, such as from 3 nm to 40 nm and/or from 10 nm to 25 nm, although lesser and greater thicknesses can also be employed.

In another embodiment, the memory material layer 16L includes a barrier modulated cell memory material. For example, oxygen-vacancy-containing metal oxides displaying different electrical conductivity characteristics depending on the level of oxygen vacancies can be deposited for the memory material layer 16L. An oxygen-vacancy-containing metal oxide can be formed with oxygen deficiencies (e.g., vacancies), or can be annealed to form oxygen deficiencies. One of the electrodes of such a memory device can include a high work function material having a work function greater than 4.5 eV, and can be employed to provide a high potential barrier for electrons at the interface with the reversibly resistance-switching material. As a result, at moderate voltages (below one volt), a very low current will flow through the reversibly resistance-switching material. The energy barrier at the interface between the electrode and the reversibly resistance-switching material can be lowered by the presence of the oxygen vacancies ($V_O^{\cdot\cdot}$). In this case, the interface between the electrode and the reversibly resistance-switching material can provide the characteristics of a low resistance contact (Ohmic contact). The oxygen vacancies in the metal oxide of the reversibly resistance-switching material function as n-type dopants, thereby transforming the originally insulating metal oxide into an electrically insulating material having a lower resistivity (but still insulating).

When a large forward bias voltage (such as a negative voltage of about −1.5 volt that is applied to the high work function electrode with respect to the opposing electrode) is applied across the reversibly resistance-switching material, the oxygen vacancies drift toward the interface between the high energy barrier material (such as platinum or n-doped polysilicon) and the reversibly resistance-switching material, and as a result, the potential barrier at the interface between the electrode and the reversibly resistance-switching material is reduced and a relatively high current can flow through the structure. The device is then in its low resistance (conductive) state in which the reversibly resistance-switching material functions as a semiconducting material or a conductive material.

The conductive path can be broken by applying a large reverse bias voltage (such as a positive voltage of about 1.5 volt that is applied to the electrode with respect to the first electrode) across the reversibly resistance-switching material. Under a suitable reverse bias condition, the oxygen vacancies move away from the proximity of the interface between the high work function material and the reversibly resistance-switching material. The resistivity of the reversibly resistance-switching material returns to its high resistance state. Both of the conductive and non-conductive states are non-volatile. Sensing the conduction of the memory storage element (for example, by applying a voltage around 0.5 volts) can easily determine the state of the resistive memory element.

While this specific conduction mechanism may not apply to all metal oxides, as a group, they have a similar behavior: transition from a low conductive state to a high conductive occurs state when appropriate voltages are applied, and the two states are non-volatile. Examples of other materials that can be used for the non-volatile resistive memory elements include hafnium oxide, such as HfO$_x$ where 1.9<x<2.1. Suitable materials for the first electrode (e.g., word line) are any conducting material such as Ti(O)N, Ta(O)N, TiN, TiAlN, WN and TaN. Suitable materials for the electrode (e.g., local bit line) include metals and doped semiconductor with a high work function (typically >4.5 eV) capable to getter oxygen in contact with the metal oxide to create oxygen vacancies at the contact. Some examples are TaCN, TiCN, Ru, RuO$_2$, Pt, Ti rich TiO$_x$, TiAlN, TaAlN, TiSiN, TaSiN, IrO$_2$ and doped polysilicon. The thicknesses of the electrodes are typically 1 nm or greater. Thicknesses of the metal oxide can be generally in the range of 2 nm to 20 nm.

In yet another embodiment, the resistive memory material employed for the memory material layer 16L can include a filamentary metal oxide material such as nickel oxide or TiO$_2$, in which electrically conductive filamentary paths can be formed or removed depending on the external electrical bias conditions.

Figure 5A:
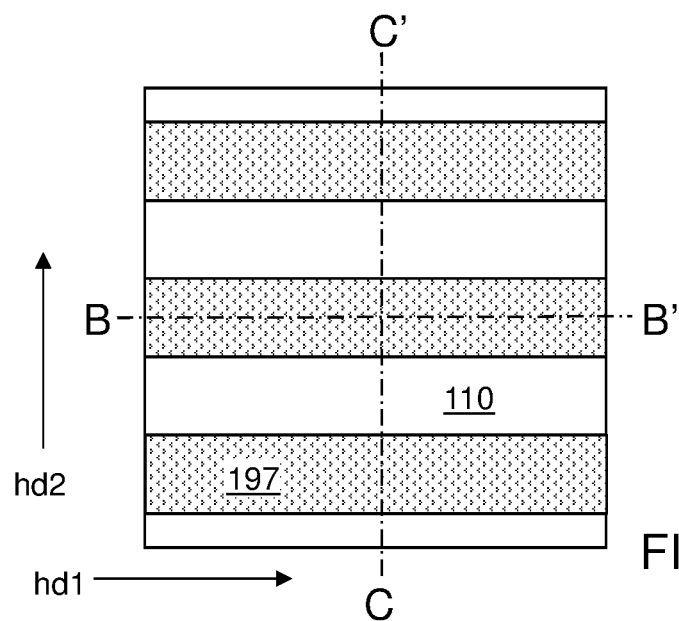
FIG. 5A is a top-down view of the exemplary structure after formation of first memory-level isolation trenches according to an embodiment of the present disclosure.
Figure 5B:
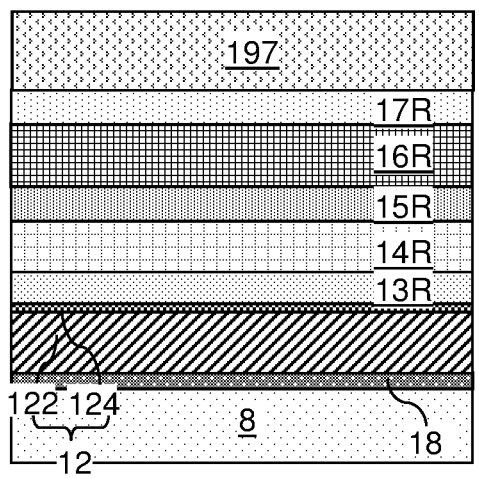
FIG. 5B is a vertical cross-sectional view of the exemplary structure along the vertical plane B-B' of FIG. 5A.
Figure 5C:
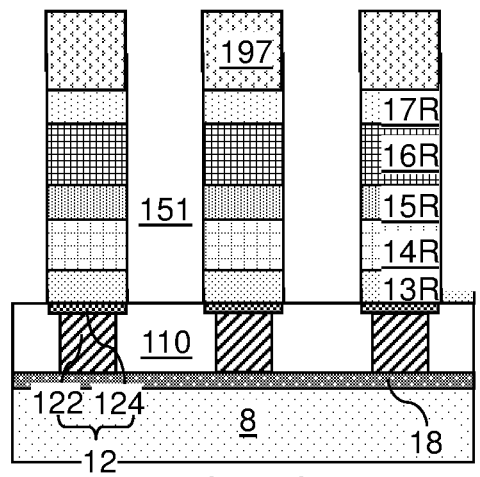
FIG. 5C is a vertical cross-sectional view of the exemplary structure along the vertical plane C-C' of FIG. 5A.

Referring to FIGS. 5A-5C, a photoresist layer 197 can be applied over the layer stack (13L, 14L, 15L, 16L, 17L), and can be lithographically patterned with a line and space pattern. The line and space pattern may be the same as the line and space pattern employed to pattern the photoresist layer 117 employed at the processing steps of FIGS. 2A-2C.

An anisotropic etch process can be performed to transfer the pattern in the photoresist layer 197 through the layer stack (13L, 14L, 15L, 16L, 17L). The anisotropic etch process can include a set of anisotropic etch steps having a respective etch chemistry that etches a respective layer within the layer stack (13L, 14L, 15L, 16L, 17L). First isolation trenches 151 laterally extending along the first horizontal direction hd1 are formed by the anisotropic etch. The first isolation trenches 151 can be line trenches having a uniform vertical cross-sectional shape within vertical planes that are perpendicular to the first horizontal direction hd1. The uniform vertical cross-sectional shape of each first isolation trench 151 can be invariant with translation along the first horizontal direction hd1.

The anisotropic etch process patterns the layer stack (13L, 14L, 15L, 16L, 17L) into rail stack structures (13R, 14R, 15R, 16R, 17R) including a respective stack of a lower conductive strip 13R, a selector material rail 14R, an intermediate conductive strip 15R, a memory material rail 16R, and a upper conductive strip 17R. Each lower conductive strip 13R is a patterned portion of the lower conductive liner 13L. Each selector material rail 14R is a patterned portion of the selector material rail 14L. Each intermediate conductive strip 15R is a patterned portion of the intermediate conductive liner 15L. Each memory material rail 16R is a patterned portion of the memory material layer 16L. Each upper conductive strip 17R is a patterned portion of the upper conductive liner 17L. Each rail stack structure (13R, 14R, 15R, 16R, 17R) can laterally extend along the first horizontal direction hd1, and can have a uniform width or a substantially uniform width along the second horizontal direction hd2. In one embodiment, each rail stack structure (13R, 14R, 15R, 16R, 17R) may have a rectangular vertical cross-sectional shape within vertical planes that are perpendicular to the first horizontal direction hd1. The photoresist layer 197 can be subsequently removed, for example, by ashing.

Figure 6A:
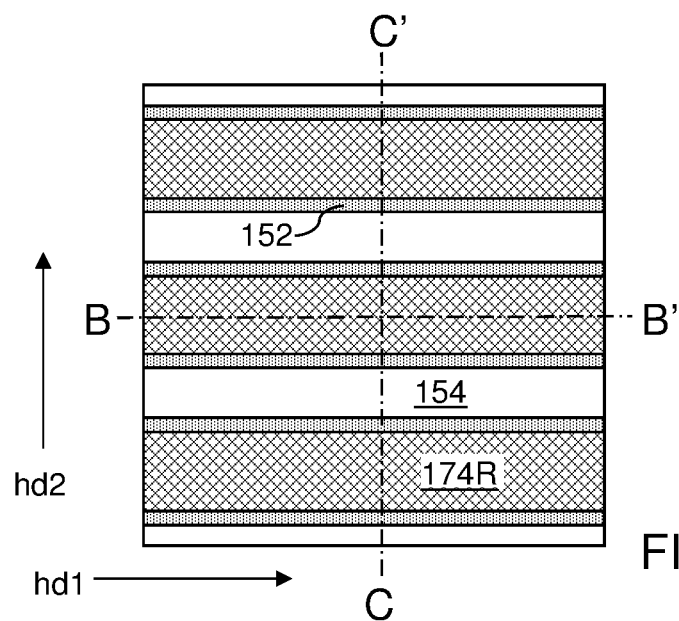
FIG. 6A is a top-down view of the exemplary structure after formation of first dielectric isolation structures according to an embodiment of the present disclosure.
Figure 6B:
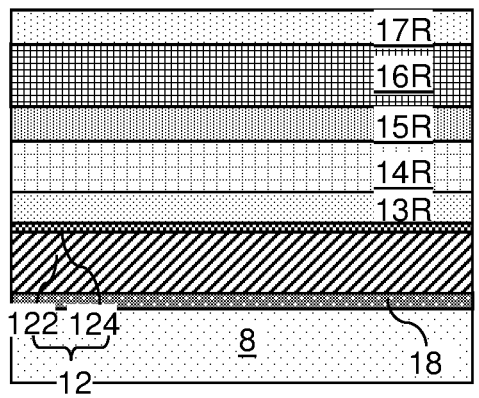
FIG. 6B is a vertical cross-sectional view of the exemplary structure along the vertical plane B-B' of FIG. 6A.
Figure 6C:
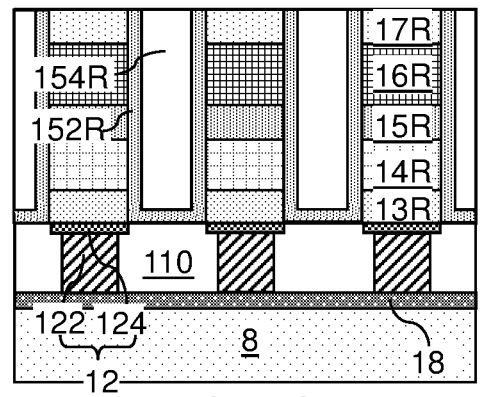
FIG. 6C is a vertical cross-sectional view of the exemplary structure along the vertical plane C-C' of FIG. 6A.

Referring to FIGS. 6A-6C, an optional first continuous dielectric liner can be optionally deposited on sidewalls and bottom surfaces of the first isolation trenches 151 and over the rail stack structures (13R, 14R, 15R, 16R, 17R). The first continuous dielectric liner includes a dielectric material such as silicon nitride, a dielectric metal oxide (such as aluminum oxide), or silicon oxide. The first continuous dielectric liner can be deposited by a conformal deposition method such as chemical vapor deposition (CVD) or atomic layer deposition (ALD). The thickness of the first continuous dielectric liner can be in a range from 1 nm to 10 nm, such as from 2 nm to 6 nm, although lesser and greater thicknesses can also be employed.

A first dielectric fill material layer can be deposited on the first continuous dielectric liner. The first dielectric fill material layer includes a planarizable dielectric material such as undoped silicate glass (e.g., silicon oxide), doped silicate glass, or a spin-on glass (SOG), or a low-k dielectric material. The first dielectric fill material layer can be deposited by a conformal deposition method or by a self-planarizing deposition method (such as spin coating). In one embodiment, the first continuous dielectric liner can include, and/or can consist essentially of, a material selected from silicon nitride and a dielectric metal oxide, and the first dielectric fill material layer can include, and/or can consist essentially of, a material selected from doped silicate glass and undoped silicate glass.

Portions of the first continuous dielectric liner and the first dielectric fill material layer can be removed from above the horizontal plane including top surfaces of the upper conductive strips 17R by a planarization process. The planarization process can include chemical mechanical planarization (CMP) and/or a recess etch process. Each remaining portion of the first continuous dielectric liner constitutes an optional first dielectric liner 152R, and each remaining portion of the first dielectric fill material layer constitutes a first dielectric fill material rail 154R. Each contiguous set of a first dielectric liner 152R and a first dielectric fill material rail 154R constitutes a first dielectric isolation rail (152R, 154R), which is a dielectric isolation structure having a shape of a rail. However, the optional first dielectric liner 152R may be omitted if desired. A first dielectric isolation rail (152R, 154R) can be formed in each of the first isolation trenches 151 as a rail structure. The first dielectric isolation rails (152R, 154R) laterally extend along the first horizontal direction hd1, and are laterally spaced among one another along the second horizontal direction hd2. The top surfaces of the first dielectric isolation rails (152R, 154R) can be coplanar with the top surfaces of the upper conductive strips 17R. The memory material layer 16L is divided into memory material rails 16R by the first dielectric isolation rails (152R, 154R).

Figure 7A:
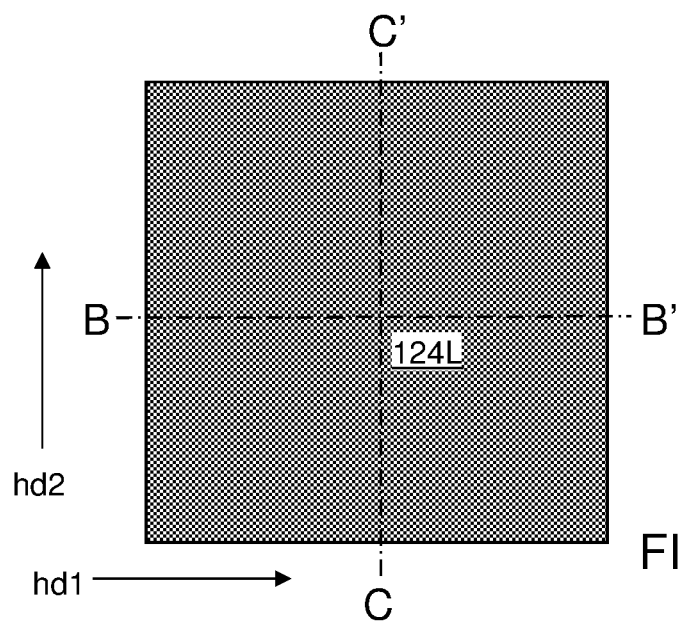
FIG. 7A is a top-down view of the exemplary structure after formation of a second metal layer and a second metallic cap layer according to an embodiment of the present disclosure.
Figure 7B:
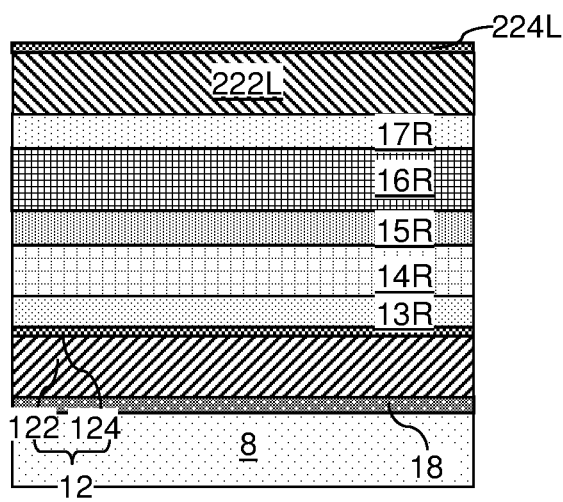
FIG. 7B is a vertical cross-sectional view of the exemplary structure along the vertical plane B-B' of FIG. 7A.
Figure 7C:
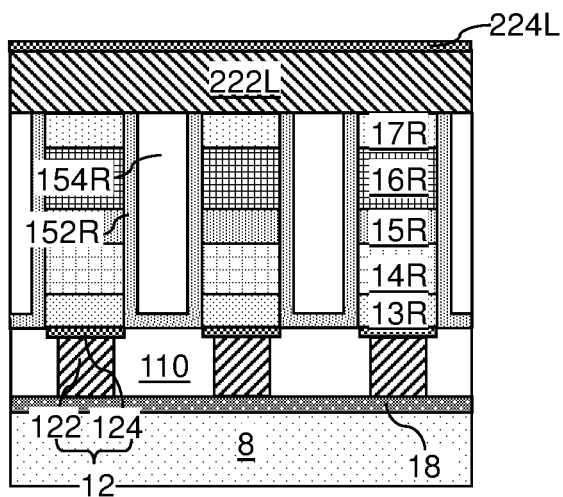
FIG. 7C is a vertical cross-sectional view of the exemplary structure along the vertical plane C-C' of FIG. 7A.

Referring to FIGS. 7A-7C, a second metal layer 222L and a second metallic cap layer 224L can be deposited over the rail stack structures (13R, 14R, 15R, 16R, 17R) and the first dielectric isolation rails (152R, 154R). According to an aspect of the present disclosure, the second metal layer 222L comprises aluminum or an aluminum-containing alloy including aluminum at an atomic percentage in a range from 90% to 100%, such as from 98% to 100%, with the remainder being alloying elements (e.g., copper and/or silicon). The second metal layer 222L can be deposited, for example, by physical vapor deposition, and can have a thickness in a range from 50 nm to 500 nm, although lesser and greater thicknesses can also be employed.

The second metallic cap layer 224L includes a hard and etch resistant cap material that can protect aluminum during a subsequent planarization process. The second metallic cap layer 224L can include a refractory transition metal in elemental form or in a form of a conductive metal alloy. For example, the second metallic cap layer 224L can comprise, and/or can consist essentially of, a metal selected from W, Ta, Mo or alloys thereof including W, Ta or Mo at an atomic percentage in a range from 90% to 100%, such as from 98% to 100% with the remainder being alloying elements (e.g., boron or silicon). The second metallic cap layer 224L can be deposited by physical vapor deposition or chemical vapor deposition. The second metallic cap layer 224L can have a thickness in a range from 2 nm to 10 nm, such as 3 nm to 5 nm, although lesser and greater thicknesses may also be employed. In one embodiment, the thickness of the second metallic cap layer 224L can be in a range from 2% to 20%, such as from 3% to 10%, of the thickness of the second metal layer 222L that comprises, and/or consists essentially of, aluminum or an aluminum-containing alloy.

Figure 8A:
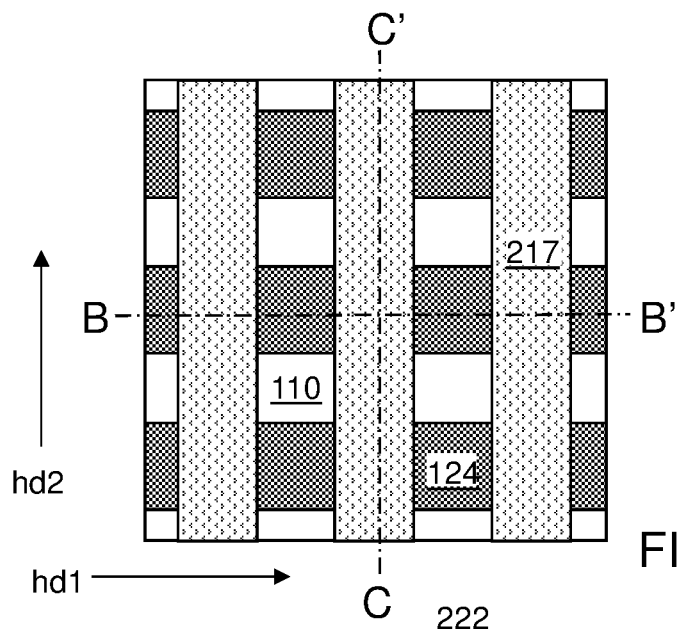
FIG. 8A is a top-down view of the exemplary structure after formation of second conductive line structures according to an embodiment of the present disclosure.
Figure 8B:
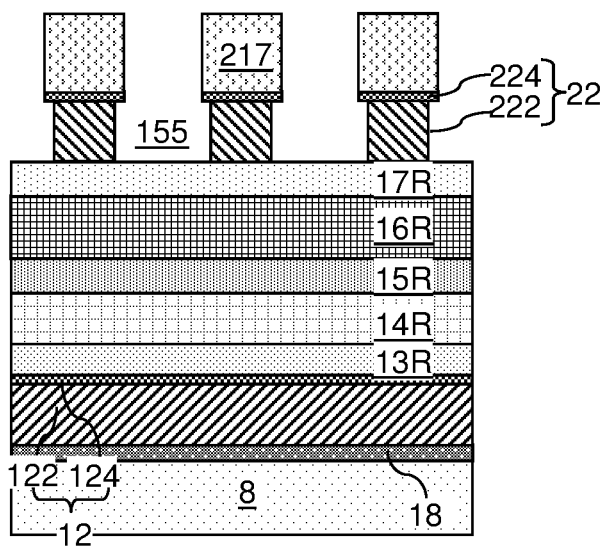
FIG. 8B is a vertical cross-sectional view of the exemplary structure along the vertical plane B-B' of FIG. 8A.
Figure 8C:
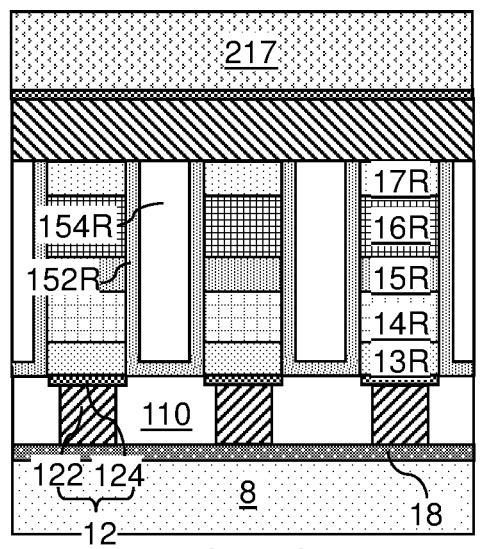
FIG. 8C is a vertical cross-sectional view of the exemplary structure along the vertical plane C-C' of FIG. 8A.

Referring to FIGS. 8A-8C, a photoresist layer 217 can be applied over the second metallic cap layer 224L, and can be lithographically patterned with a line and space pattern. Elongated openings laterally extending along the second horizontal direction hd2 and laterally spaced apart among one another along the first horizontal direction hd1 can be formed in the photoresist layer 217. The openings in the photoresist layer 217 can have the same width along the first horizontal direction hd1 that is invariant with translation along the second horizontal direction hd2. The width of each opening along the first horizontal direction hd1 can be in a range from 20 nm to 50 nm, such as 25 nm to 40 nm, although lesser and greater widths can also be employed.

The pattern in the photoresist layer 217 can be transferred through the second metallic cap layer 224L and the second metal layer 222L by a second anisotropic etch process. The photoresist layer 217 having the line and space pattern can be employed as an etch mask during the first anisotropic etch process. The second anisotropic etch process may employ a chlorine-based and/or a fluorine-based etch chemistry, as described above for the first anisotropic etch process. The layer stack of the second metallic cap layer 224L and the second metal layer 222L can be patterned into second conductive line structures 22. Each second conductive line structure 22 includes a second aluminum-containing rail 222 and a second metallic cap strip 224. Each patterned portion of the second metal layer 222L comprises a second aluminum-containing rail 222. Each patterned portion of the second metallic cap layer 224L comprises a second metallic cap strip 224. Each second metallic cap strip is a rail structure having a thickness that is less than a width along the second horizontal direction hd2. The photoresist layer 217 can be subsequently removed, for example, by ashing.

Each second conductive line structure 22 can include a vertical stack of a second aluminum-containing rail 222 and a second metallic cap strip 224. In one embodiment, sidewalls of the second aluminum-containing rail 222 can be vertically coincident with the sidewalls of the second metallic cap strip 224 within each second conducive line structure 22. This configuration can be achieved in case the anisotropic etch process that patterns the second conductive line structures 22 forms vertical sidewalls and does not provide collateral lateral etching during the anisotropic etch process. Second line trenches 211 can be formed between each laterally neighboring pair of second conductive line structures 22.

In an alternative embodiment shown in FIG. 8B, a selective isotropic etch process can be performed to laterally recess sidewalls of the second aluminum-containing rails 222. The selective isotropic etch process may employ a dry etch process (such as a chemical dry etch process) or a wet etch process. The chemistry of the selective isotropic etch process can be selected such that aluminum is etches selective to the material of the second metallic cap strips 224. For example, a chemical etch process employing ferric chloride (FeCl$_3$) or a mixture of phosphoric acid, nitric acid, and acetic acid may be employed to laterally recess the second aluminum-containing rails 222. Alternatively, the anisotropic etch process may include an isotropic etchant to provide lateral recessing of the sidewalls of the second aluminum-containing rails 222. The lateral recess distance may be in a range from 2 nm to 20 nm, such as from 2 nm to 10 nm, although lesser and greater lateral recess distances may also be employed.

In case the second aluminum-containing rails 222 are laterally recessed relative to the second metallic cap strips 224, the second aluminum-containing rails 222 can have a lesser width than a respective overlying second metallic cap strip 224 within each of the second conductive line structures 22. In one embodiment, a pair of lengthwise sidewalls of each second aluminum-containing rails 222 can be laterally recessed from a pair of lengthwise sidewalls of a respective overlying second metallic cap strip 224 by a uniform lateral recess distance. A set of second conductive line structures 22 laterally extending along the second horizontal direction hd2 is formed over the rail stack structures (13R, 14R, 15R, 16R, 17R) and the first dielectric isolation rails (152R, 154R). Second isolation trenches 155 can be formed between each neighboring pair of second conductive line structures 22.

Generally, at least one, such as both, of the set of first conductive line structures 12 and the set of second conductive line structures 22 can be formed by depositing a layer stack including, from bottom to top, an aluminum layer and a metallic cap material layer, and by patterning the layer stack into a set of conductive line structures (12 and/or 22). Each of the conductive line structures (12 and/or 22) comprises a respective aluminum-containing rail (such as a first aluminum-containing rail 122 or a second aluminum-containing rail 222) that is a patterned portion of the aluminum layer and a respective metallic cap strip (such as a first metallic cap strip 124 or a second metallic cap strip 223) that is a patterned portion of the metallic cap material layer. Optionally, sidewalls of the aluminum-containing rails may be laterally recessed by selectively etching aluminum selective to the metallic cap strips during, or after, the anisotropic etch process that patterns the conductive line structures (12 and/or 22). In this case, the aluminum-containing rail (122 and/or 222) may have a lesser width than the respective metallic cap strip within each of the conductive line structures (12 and/or 22). A pair of lengthwise sidewalls of each aluminum-containing rail (122 or 222) may be laterally recessed a pair of lengthwise sidewalls of a respective overlying metallic cap strip (124 or 224) by a uniform lateral recess distance.

Figure 9A:
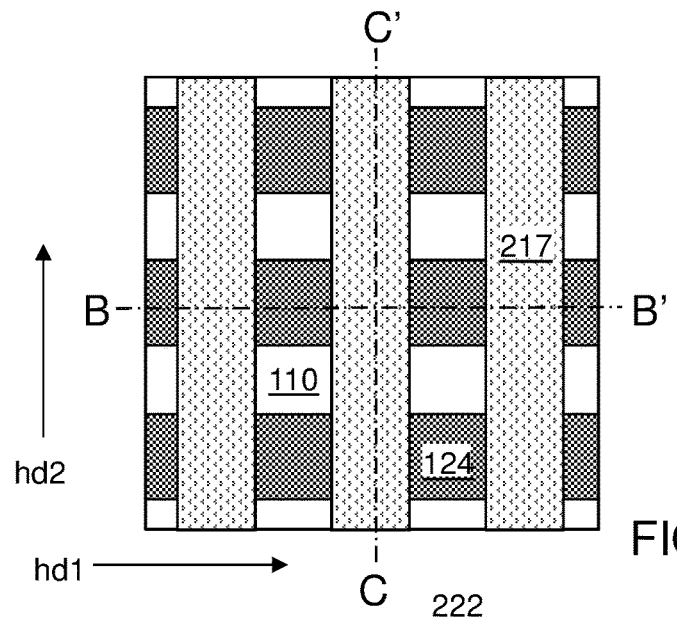
FIG. 9A is a top-down view of the exemplary structure after formation of memory pillar structures according to an embodiment of the present disclosure.
Figure 9B:
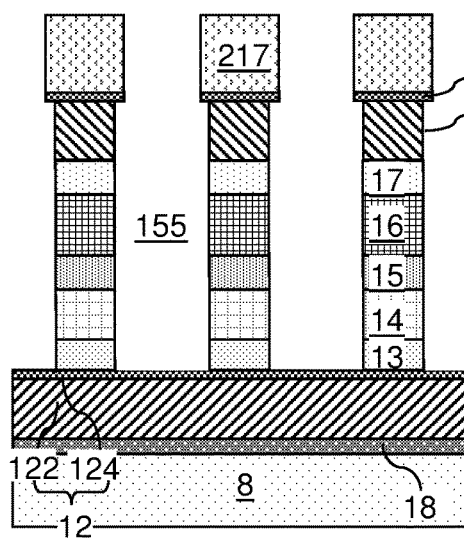
FIG. 9B is a vertical cross-sectional view of the exemplary structure along the vertical plane B-B' of FIG. 9A.
Figure 9C:
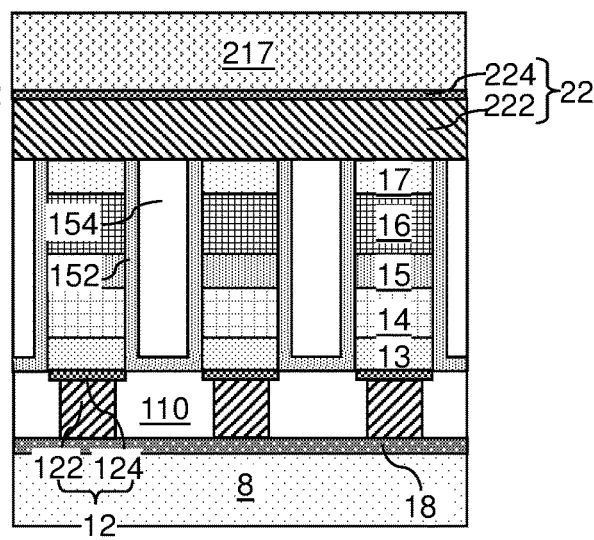
FIG. 9C is a vertical cross-sectional view of the exemplary structure along the vertical plane C-C' of FIG. 9A.

Referring to FIGS. 9A-9C, a second anisotropic etch process can be performed after the first anisotropic etch process to transfer the pattern in the photoresist layer 217 through the rail stack structures (13R, 14R, 15R, 16R, 17R) and the first dielectric isolation rails (152R, 154R). The second anisotropic etch process etches unmasked portions of the rail stack structures (13R, 14R, 15R, 16R, 17R) and the first dielectric isolation rails (152R, 154R). The second anisotropic etch process divides the rail stack structures (13R, 14R, 15R, 16R, 17R) into a two-dimensional array of memory pillar structures (13, 14, 15, 16, 17). Each memory pillar structure (13, 14, 15, 16, 17) includes a vertical stack of a lower conductive plate 13, a selector element 14, an intermediate conductive plate 15, a memory element 16, and an upper conductive plate 17. Each lower conductive plate 13 can be a patterned portion of a lower conductive strip 13R. Each selector element 14 can be a patterned portion of a selector material rail 14R, and thus, can include a selector material portion. Each intermediate conductive plate 15 can be a patterned portion of an intermediate conductive strip 15R and may include layers 15C and 15M described above with respect to FIG. 4D. Each memory element 16 can be a patterned portion of a memory material rail 16R, and thus, can include a memory material portion. Each upper conductive plate 17 can be a patterned portion of an upper conductive strip 17R may include layers 17C and 17M described above with respect to FIG. 4D.

Each first dielectric isolation rail (152R, 154R) is divided into a respective row of dielectric pillar structures (152, 154). Each dielectric pillar structure (152, 154) includes an optional respective U-shaped dielectric liner 152 and a respective dielectric pillar structure 154. Each U-shaped dielectric liner 152 (if present) is a patterned portion of a first dielectric liner 152R. Each dielectric pillar structure 154 is a patterned portion of a first dielectric fill material rail 154R.

An array of memory pillar structures (13, 14, 15, 16, 17) can be formed over top surfaces of the first conductive line structures 12. Each of the memory pillar structures (13, 14, 15, 16, 17) includes a respective memory element 16 and a respective selector (i.e., steering) element 14. In one embodiment, the array of memory pillar structures (13, 14, 15, 16, 17) can be arranged in columns that laterally extend along the first horizontal direction hd1, and in rows that laterally extend along the second horizontal direction hd1. In one embodiment, each column of the memory pillar structures (13, 14, 15, 16, 17) can be formed directly on a top surface of a respective one of the first conductive line structures 12. In one embodiment, each of the second conductive line structures 22 can be formed on a respective row of memory pillar structures (13, 14, 15, 16, 17) within the array of memory pillar structures (13, 14, 15, 16, 17). The second horizontal direction hd2 can be perpendicular to the first horizontal direction hd1, and the array of memory pillar structures (13, 14, 15, 16, 17) can be formed as a two-dimensional rectangular periodic array of memory pillar structures (13, 14, 15, 16, 17). In one embodiment, each of the memory pillar structures (13, 14, 15, 16, 17) can have a respective rectangular horizontal cross-sectional shape. In one embodiment, each of the memory pillar structures (13, 14, 15, 16, 17) comprises a vertical stack of a memory element 16 and a selector element 14.

Figure 10A:
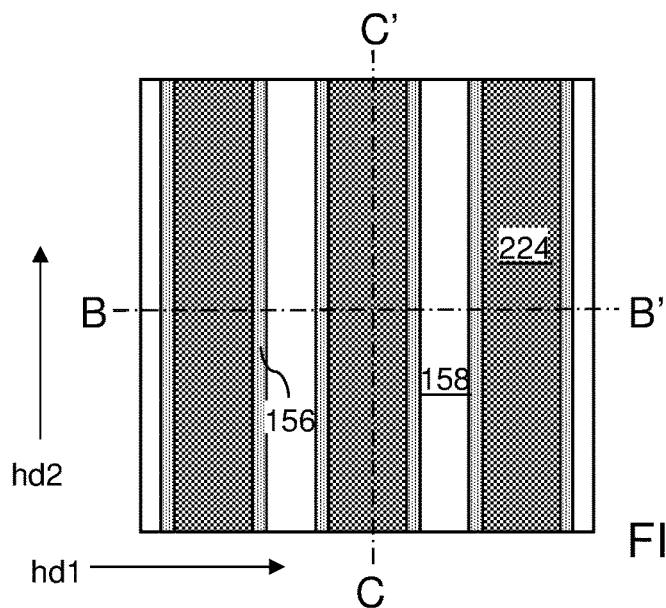
FIG. 10A is a top-down view of the exemplary structure after formation second dielectric isolation structures according to an embodiment of the present disclosure.
Figure 10B:
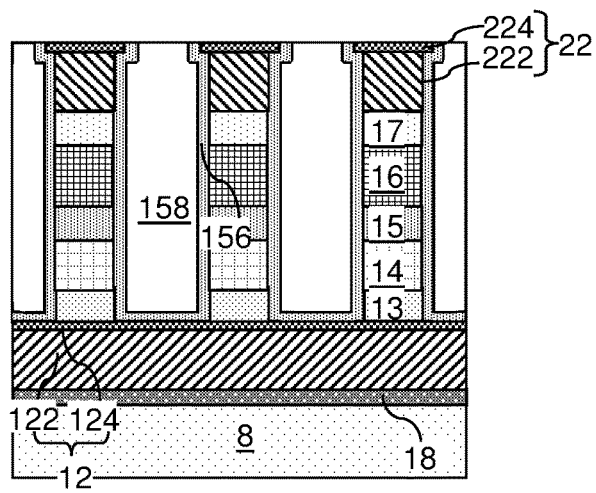
FIG. 10B is a vertical cross-sectional view of the exemplary structure along the vertical plane B-B' of FIG. 10A.
Figure 10C:
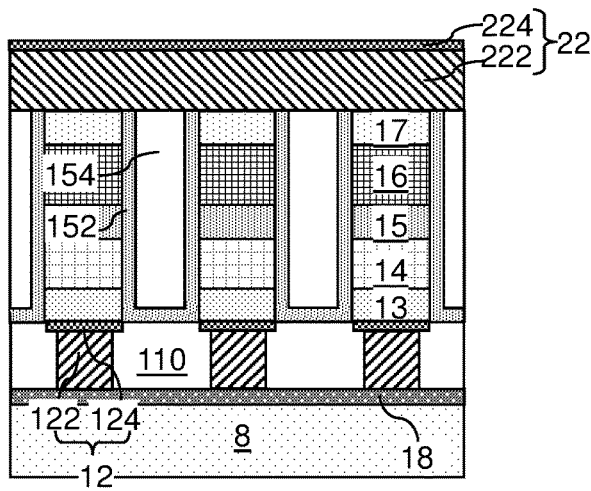
FIG. 10C is a vertical cross-sectional view of the exemplary structure along the vertical plane C-C' of FIG. 10A.

Referring to FIGS. 10A-10C, an optional second continuous dielectric liner can be optionally deposited on sidewalls and bottom surfaces of the second isolation trenches 155 and over the array of memory pillar structures (13, 14, 15, 16, 17). The second continuous dielectric liner includes a dielectric material such as silicon nitride, a dielectric metal oxide (such as aluminum oxide), or silicon oxide. The second continuous dielectric liner can be deposited by a conformal deposition method such as chemical vapor deposition (CVD) or atomic layer deposition (ALD). The thickness of the second continuous dielectric liner can be in a range from 1 nm to 10 nm, such as from 2 nm to 6 nm, although lesser and greater thicknesses can also be employed.

A second dielectric fill material layer can be deposited on the second continuous dielectric liner. The second dielectric fill material layer includes a planarizable dielectric material such as undoped silicate glass (e.g., silicon oxide), doped silicate glass, or a spin-on glass (SOG), or a low-k dielectric material. The second dielectric fill material layer can be deposited by a conformal deposition method or by a self-planarizing deposition method (such as spin coating). In one embodiment, the second continuous dielectric liner can include, and/or can consist essentially of, a material selected from silicon nitride and a dielectric metal oxide, and the second dielectric fill material layer can include, and/or can consist essentially of, a material selected from doped silicate glass and undoped silicate glass.

Portions of the second continuous dielectric liner (if present) and the second dielectric fill material layer can be removed from above the horizontal plane including top surfaces of the array of memory pillar structures (13, 14, 15, 16, 17) by a planarization process. The planarization process can include etch back and/or chemical mechanical planarization (CMP) followed by a post CMP cleaning. The hard and etch resistant metallic cap strip 224 protects the underlying aluminum-containing rail 222 from damage during CMP and post CMP cleaning.

Each remaining portion of the optional second continuous dielectric liner (if present) constitutes a second dielectric liner 156, and each remaining portion of the second dielectric fill material layer constitutes a second dielectric fill material rail 158. Each contiguous set of a second dielectric liner 156 and a second dielectric fill material rail 158 constitutes a second dielectric isolation rail (156, 158), which is a dielectric isolation structure having a shape of a rail. A second dielectric isolation rail (156, 158) can be formed in each of the second isolation trenches 155 as a rail structure. The second dielectric isolation rails (156, 158) laterally extend along the second horizontal direction hd2, and are laterally spaced among one another along the first horizontal direction hd1. The top surfaces of the second dielectric isolation rails (156, 158) can be coplanar with the top surfaces of the array of memory pillar structures (13, 14, 15, 16, 17).

In one embodiment, the second dielectric isolation rails (156, 158) can be formed between each laterally neighboring pair of the second conductive line structures 22 by depositing at least one dielectric fill material (156, 158) between, and over, the second conductive line structures 22, and by removing portions of the at least one dielectric fill material from above a horizontal plane including top surfaces of the second conductive line structures 22. Remaining portions of the at least one dielectric fill material comprise the second dielectric isolation rails (156, 158).

Figure 11A:
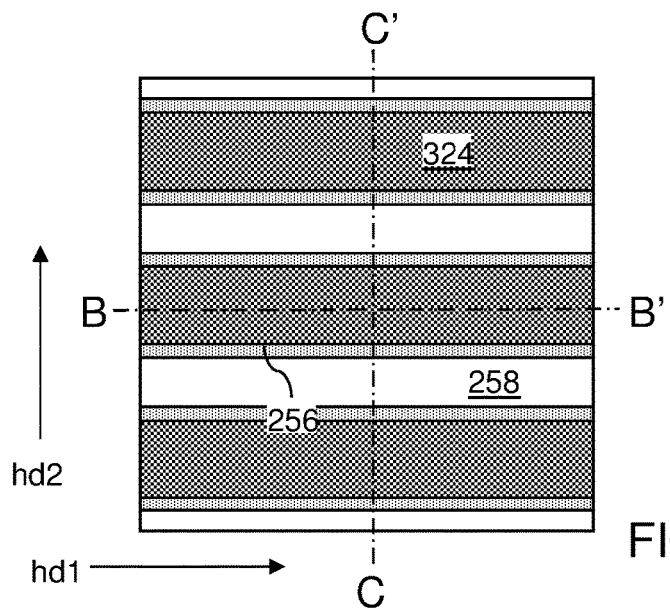
FIG. 11A is a top-down view of the exemplary structure after formation of another level of memory pillar structures and third conductive line structures according to an embodiment of the present disclosure.
Figures 11B, 11C:
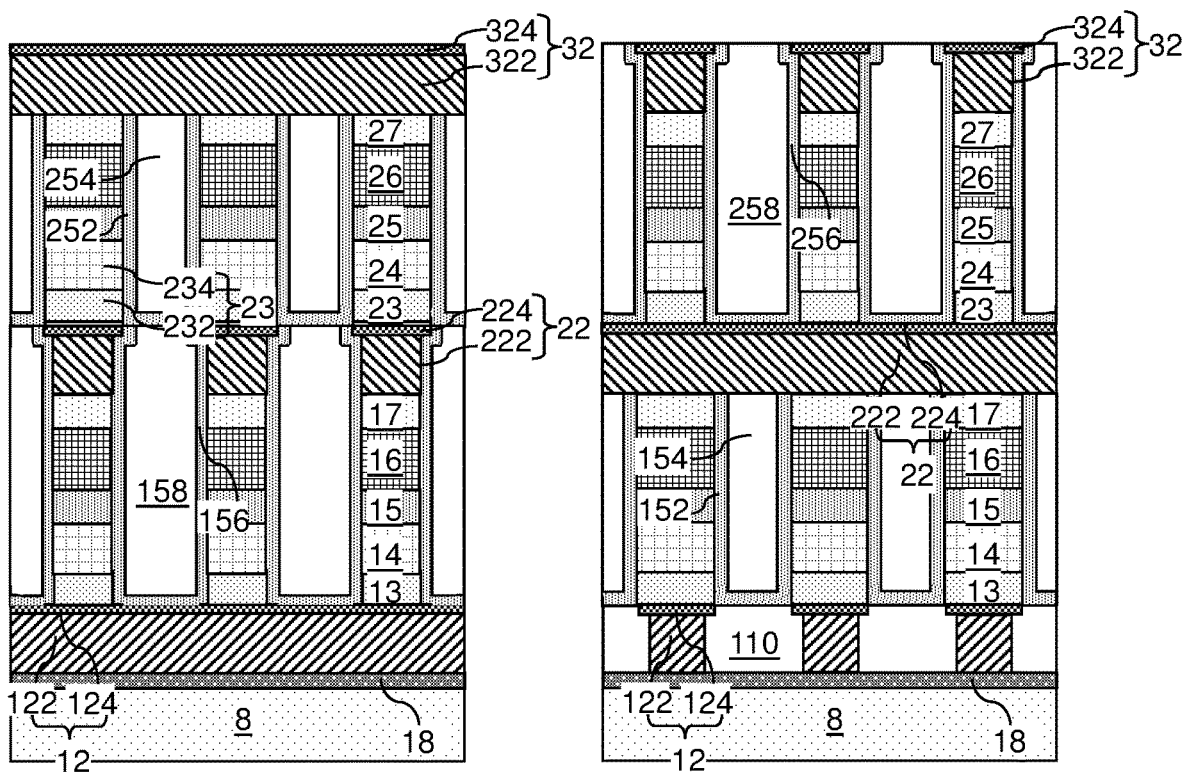
FIG. 11B is a vertical cross-sectional view of the exemplary structure along the vertical plane B-B' of FIG. 11A.
FIG. 11C is a vertical cross-sectional view of the exemplary structure along the vertical plane C-C' of FIG. 11A.

Referring to FIGS. 11A-11C, the processing steps of FIGS. 4A-10C can be repeated with a pattern rotation by 90 degrees to form another two-dimensional memory array including another two-dimensional array of memory pillar structures (23, 24, 25, 26, 27), another two-dimensional array of dielectric pillar structures (252, 254), another row of dielectric isolation rails (256, 258), and third conductive line structures 32. Each memory pillar structure (23, 24, 25, 26, 27) can include a vertical stack of a lower conductive plate 23, a selector element 24, an intermediate conductive plate 25, a memory element 26, and an upper conductive plate 27. Each dielectric pillar structure (252, 254) can include an optional U-shaped dielectric liner 252 and a dielectric pillar structure 254. Each dielectric isolation rail (256, 258) can include a dielectric liner 256 and a dielectric fill material rail 258. Each third conductive line structure 32 can include an aluminum-containing rail 222 and a metallic cap strip 324.

Figure 12A:
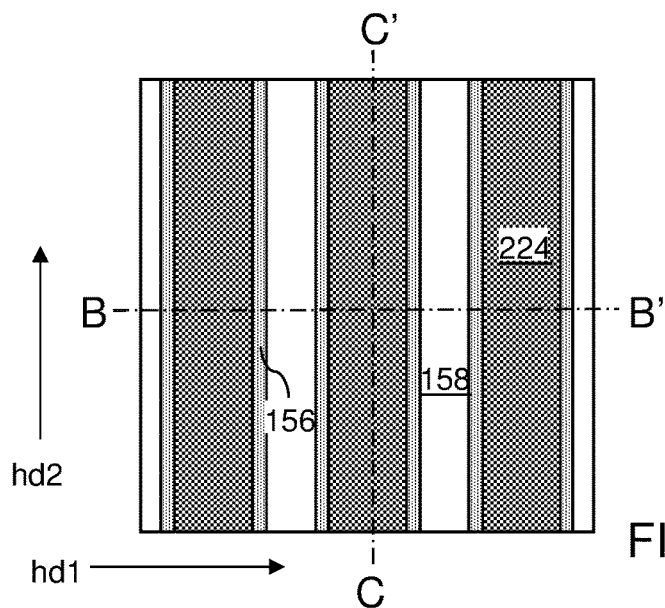
FIG. 12A is a top-down view of an alternative configuration of the exemplary structure according to an embodiment of the present disclosure.
Figure 12B:
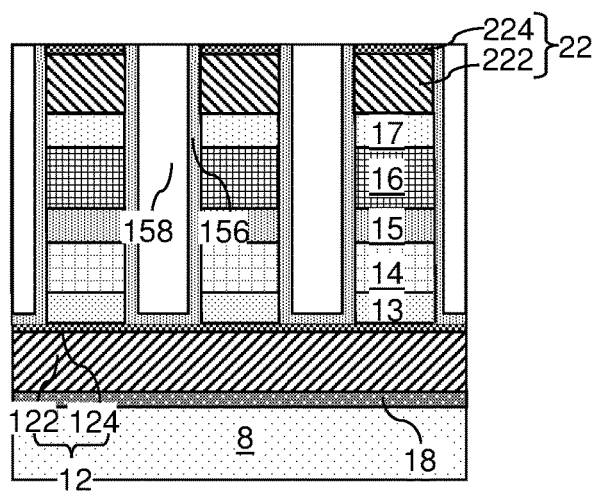
FIG. 12B is a vertical cross-sectional view of the exemplary structure along the vertical plane B-B' of FIG. 12A.
Figure 12C:
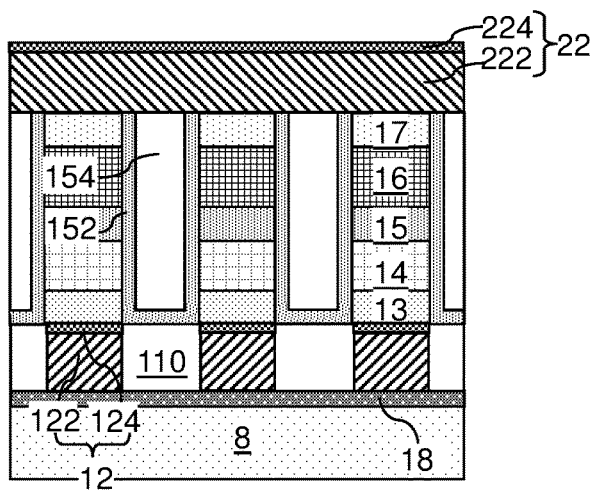
FIG. 12C is a vertical cross-sectional view of the exemplary structure along the vertical plane C-C' of FIG. 12A.

Referring to FIGS. 12A-12C, an alternative configuration of the exemplary structure according to an embodiment of the present disclosure can be derived from the exemplary structure of FIGS. 10A-10C by omitting lateral recessing of the first aluminum-containing rails 122 and/or by omitting lateral recessing of the second aluminum-containing rails 222. In this case, the sidewalls of the first aluminum-containing rails 122 can be vertically coincident with sidewalls of the first metallic cap strips 124, and/or the sidewalls of the second aluminum-containing rails 222 can be vertically coincident with sidewalls of the second metallic cap strips 224.

Referring to all drawings and according to various embodiments of the present disclosure, a cross-point memory device includes first conductive line structures 12 laterally extending along a first horizontal direction hd1, an array of memory pillar structures (13, 14, 15, 16, 17) overlying top surfaces of the first conductive line structures 12, such that each of the memory pillar structures includes a respective memory element 16, and second conductive line structures 22 laterally extending along a second horizontal direction hd2 and overlying top surfaces of the array of memory pillar structures. At least one of the first conductive line structures 12 and the second conductive line structures 22 each includes a respective aluminum-containing rail (122, 222) and a respective metallic cap strip (124, 224) in contact with a top surface of the respective aluminum-containing rail.

In one embodiment, the second horizontal direction hd2 is perpendicular to the first horizontal direction hd1, and each of the memory pillar structures (13, 14, 15, 16, 17) has a respective rectangular horizontal cross-sectional shape. In one embodiment, the respective metallic cap strip (124, 224) comprises a refractory metal or a refractory metal alloy, such as a refractory metal selected from W, Ta or Mo or alloys thereof, and the respective aluminum-containing rail (122, 222) includes aluminum atoms at an atomic percentage in a range from 90% to 100%.

In one embodiment, the respective aluminum-containing rail (122 and/or 222) has a lesser width than the respective metallic cap strip (124 and/or 224) within each of the conductive line structures (12 and/or 22). In one embodiment, a pair of lengthwise sidewalls of the respective aluminum-containing rail (122 and/or 222) can be laterally recessed from a respective one of a pair of lengthwise sidewalls of the respective metallic cap strip (124 and/or 224) by a uniform lateral recess distance. In one embodiment, the respective metallic cap strip (124 and/or 224) has a same width as the respective aluminum-containing rail (122 and/or 222).

In one embodiment, the second conductive line structures 22 each comprise the respective aluminum-containing rail 222 and the respective metallic cap strip 224. In another embodiment, both the first and the second conductive line structures (12, 22) each comprise the respective aluminum-containing rail (122, 222) and the respective metallic cap strip (124, 224).

In one embodiment, each of the memory pillar structures (13, 14, 15, 16, 17) comprises a respective ovonic threshold switch selector element 14 in a series connection with the respective memory element 16. In one embodiment, each of the memory elements 16 comprises a phase change material.

Generally, low resistance of access lines (such as the first conductive line structures 12 and/or the second conductive line structures 22) provide reduce power consumption and to provide a high operational speed in a cross-point memory device. Metals have a narrow wire effect, in which the resistance of a metal line increases as the dimensions of metal lines shrink. To minimize the adverse impact of the narrow wire effect on device performance, an anneal process can be employed, which increases the average grain size of the metal line and reduces grain boundaries.

While tungsten is employed for access lines in prior art cross-point array devices, tungsten has a high melting point of about 3422° C. An effective anneal process that sufficiently increases the grain size of tungsten typically requires an elevated temperature higher than 850° C. Such a high temperature can damage or decompose the selector material, such as ovonic threshold switch materials. Typical ovonic threshold switch materials are thermally stable up to only about 450° C. Thus, devices employing tungsten metal lines and an ovonic threshold switch material cannot be annealed sufficiently to increase the grain size of tungsten.

Tungsten, ruthenium, copper, and aluminum provide bulk electrical resistivity of about 5.3 µΩ-cm, about 7.8 µΩ-cm, about 1.68 µΩ-cm, and about 2.82 µΩ-cm, respectively, in a film thickness range from 5 nm to 40 nm. Thus, ruthenium, copper, and aluminum provide lower electrical resistivities than tungsten in thin films. However, effective anisotropic etch processes for etching ruthenium and copper are not readily available in the art. In other words, the use of ruthenium or copper as access metal lines (such as word lines or bit lines) typically requires the use of complicated damascene processes. In this case, a metallic barrier layer is deposited in line trenches, and the width of ruthenium lines or copper lines decreases by twice the thickness of the metallic barrier layer. Thus, use of a damascene process effectively reduces the width of a metal that can provide high electrical conductivity.

While subtractive etch processes (such as reactive ion etch processes) for etching aluminum are known in the art, patterning of aluminum poses a different problem. Specifically, aluminum surface is soft and is prone to scratching or other structural damages during a chemical mechanical planarization process. While tungsten has Young's modulus of 411 GPa, aluminum has Young's modulus of only 69 GPa. Thus, a chemical mechanical planarization process can induce significant damage to aluminum surfaces.

According to an aspect of the present disclosure, aluminum is employed for the majority of volume of a composite conductive rail that functions a metal line. Aluminum can be patterned employing a subtractive patterning process such as a reactive ion etch process. Thus, a metallic barrier layer is not necessary on the sidewalls of the patterned aluminum portion such as the first conductive line structures 12 and the second conductive line structures 22. The metallic cap strips (124 and/or 224) can include a hard and etch and scratch resistant material such as W, Ta or W. The thickness of the metallic cap layer (124 and/or 224) can be at least one order of magnitude less than the thickness of the aluminum-containing rails (122 and/or 222). In one embodiment, the thickness of the metallic cap strips (124 and/or 224) can be in a range from 2% to 20%, such as from 3% to 10%, of the thickness of the aluminum-containing rails (122 and/or 222) that comprises, and/or consists essentially of, aluminum or an aluminum-containing alloy.

In some embodiments, the material of at least one of the lower conductive liner 13L, the intermediate conductive liner 15L, and the upper conductive liner 17L may be the same as the material of the second metallic cap strips 224. In this case, the anisotropic etch processes that pattern the second metallic cap layer 224L, the lower conductive liner 13L, the intermediate conductive liner 15L, and the upper conductive liner 17L may employ the same etch chemistry. In one embodiment, the second metallic cap layer 224L, the lower conductive liner 13L, the intermediate conductive liner 15L, and the upper conductive liner 17L may include the same metallic material, and the first anisotropic etch process that etches the second metallic cap layer 224L and the second anisotropic etch process that etches the lower conductive liner 13L, the intermediate conductive liner 15L, and the upper conductive liner 17L may employ the same etch chemistry so that variations in the collateral etch on physically exposed surfaces of previously etched materials may be minimized.

In case the metallic cap strips (124 and/or 224) have a greater width than the underlying aluminum-containing rails (122 and/or 222), the metallic cap strips (124 and/or 224) can provide enhanced protection against solvent penetration to the aluminum-containing rails (122 and/or 222) during the post CMP cleaning. Thus, the aluminum-containing rails (122 and/or 222) can be protected from undesirable collateral etching a post CMP cleaning process.

Further, anneal temperature after formation of the first conductive line structures 12 and/or the second conductive line structures 22 for increasing the grain size can be significantly reduced because an anneal process at a temperature of about 300° C. is sufficient to increase the grain size in the aluminum-containing rails (122 and/or 222). Thus, materials that are susceptible to thermal decomposition (such as an ovonic threshold switch material) can be patterned without damage.

In addition, in case the memory elements 16 include a phase change memory material, mechanical collapse of memory cells due to volume changes during the phase change of the memory elements 16 can be suppressed because aluminum has lower Young's modulus than tungsten, and thus, can deform more easily during the volume change of the phase change memory material. In other words, reliability of a memory cell including a phase change memory material can be enhanced.

Furthermore, the metallic cap strips (124 and/or 224) can suppress electromigration of aluminum in the aluminum-containing rails (122 and/or 222), and can increase the lifetime and the reliability of the conductive line structures (12 and/or 22).

Although the foregoing refers to particular preferred embodiments, it will be understood that the disclosure is not so limited. It will occur to those of ordinary skill in the art that various modifications may be made to the disclosed embodiments and that such modifications are intended to be within the scope of the disclosure. Where an embodiment employing a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A method of forming a cross-point memory device, comprising:

forming a set of first conductive line structures laterally extending along a first horizontal direction over a substrate;

forming memory-level material layers over the set of first conductive line structures;

forming a set of second conductive line structures laterally extending along a second horizontal direction over top surfaces of the array of memory pillar structures; and patterning the memory-level material layers into an array of memory pillar structures, wherein:

each of the memory pillar structures comprises a respective memory element and both of the first conductive line structures and the second conductive line structures each comprise a respective aluminum-containing rail and a respective metallic cap strip in contact with a top surface of the respective aluminum-containing rail;

wherein both of the first conductive line structures and the second conductive line structures are formed by:

depositing a layer stack including, from bottom to top, an aluminum layer and a refractory metal or a refractory metal alloy metallic cap material layer; and patterning the layer stack into the set of conductive line structures, wherein each of the conductive line structures comprises the respective aluminum-containing rail that is a patterned portion of the aluminum layer and the respective metallic cap strip that is a patterned portion of the cap material layer; and further comprising laterally recessing sidewalls of the aluminum-containing rails by selectively etching aluminum selective to the metallic cap strips during or after a first anisotropic etch process.

2. A method of forming a cross-point memory device, comprising:

forming a set of first conductive line structures laterally extending along a first horizontal direction over a substrate;

forming memory-level material layers over the set of first conductive line structures;

forming a set of second conductive line structures laterally extending along a second horizontal direction over top surfaces of the array of memory pillar structures;

patterning the memory-level material layers into an array of memory pillar structures, wherein each of the memory pillar structures comprises a respective memory element, and at least one of the first conductive line structures and the second conductive line structures each comprise a respective aluminum-containing rail and a respective metallic cap strip in contact with a top surface of the respective aluminum-containing rail; and forming dielectric isolation rails between each laterally neighboring pair of conductive line structures by:

depositing at least one dielectric fill material between and over the conductive line structures; and removing portions of the at least one dielectric fill material from above a horizontal plane including top surfaces of the conductive line structures using chemical mechanical planarization, wherein remaining portions of the dielectric fill material comprise the dielectric isolation rails and wherein the metallic cap strips protect the underlying aluminum-containing rails during the chemical mechanical planarization.

\* \* \* \* \*